United States Patent [19]
Maerfeld

[11] 3,947,783
[45] Mar. 30, 1976

[54] ACOUSTIC SURFACE WAVE DEVICE COMPRISING ARRAYS OF PARALLEL METALLIC STRIPS

[75] Inventor: Charles Maerfeld, Paris, France
[73] Assignee: Thomson-CSF, Paris, France
[22] Filed: Aug. 1, 1974
[21] Appl. No.: 493,976

[30] Foreign Application Priority Data
Aug. 7, 1973   France .................. 73.28793

[52] U.S. Cl. ............... 333/30 R; 310/8.2; 310/9.8; 333/72
[51] Int. Cl.². H03H 9/26; H03H 9/30; H03H 9/32; H01L 41/10
[58] Field of Search ........ 333/30 R, 72; 310/8, 8.1, 310/8.2, 9.7, 9.8

[56] References Cited
UNITED STATES PATENTS
3,739,290  6/1973  Marshall et al. ........... 333/30 R UX
3,836,876  9/1974  Marshall et al. .................. 333/72 X OTHER PUBLICATIONS
Marshall et al —"Theory and Design of the Surface Acoustic Wave Multistrip Coupler" in IEEE Trans. on Sonics and Ultrasonics, Vol. SU–20, No. 2, Apr. 1973, pp. 124–133.

Primary Examiner—Alfred E. Smith
Assistant Examiner—Marvin Nussbaum
Attorney, Agent, or Firm—Roland Plottel

[57] ABSTRACT

The invention concerns acoustic surface wave devices with multistrip couplers. The coupler of such a device comprises two arrays of N conductive strips connected by a connecting array and having at least one characteristic, such as for example their periodicity which is distinct for the two arrays. In modifying, for example, the ratio $p_1/p_2$ of the periodicities of the arrays, the operation of this device is modified. This device permits in particular the construction, for wide frequency bands of utilisation of n dB couplers, energy concentrators or unidirectional transducers.

5 Claims, 4 Drawing Figures

ACOUSTIC SURFACE WAVE DEVICE COMPRISING ARRAYS OF PARALLEL METALLIC STRIPS

The present invention relates to acoustic surface wave devices comprising arrays of parallel conductive strips disposed along the propagation paths of acoustic waves, perpendicularly to said direction of propagation.

As is known, for example from French Pat. No. 72.15968 published under U.S. Pat. No. 2,135,303 and entitled "Dispositif à ondes acoustiques de surface" the purpose of the arrays of conductive strips is to provide a coupling between plurality of acoustic surface wave propagation paths so as to transfer entirely or partly the energy from one path to another path. Several different applications are possible, such as for example concentration of acoustic surface wave beams, by acting on the number of conductive strips of the arrays and their phase shifts. However, an important disadvantage of the known devices is that their operating frequency band is relatively narrow. It is particularly crucial for beam concentrators in which the arrays employed for each of the paths have a phase shift of one quarter of an acoustic wavelength.

An object of the present invention is to overcome this drawback and to provide devices which are capable of operating in a wide frequency band.

According to one feature of the present invention such a result is obtained by employing non identical arrays one or more parameters of which (such as their periodicity, their width or the widths of their conductive strips) are chosen in a ratio which is different from one.

Further features and advantages of the present invention will be apparent from the ensuing description given merely by way of example with reference to the accompanying drawings in which.

Figure 1:
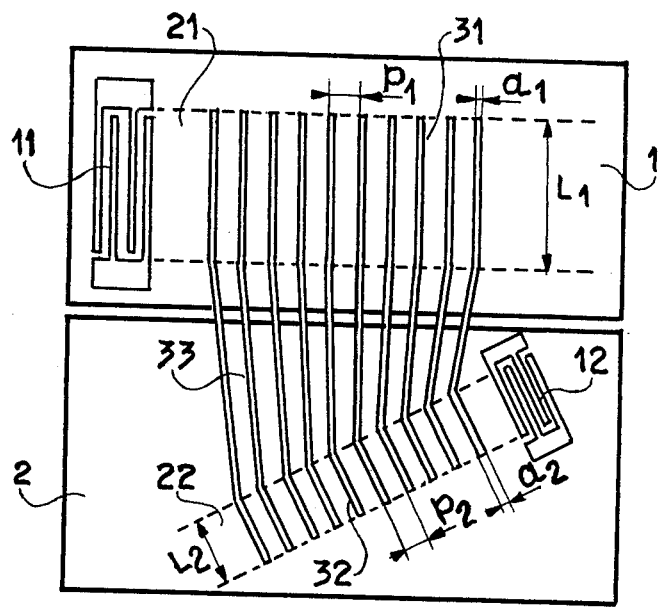
FIG. 1 shows an embodiment of a device according to the invention employed as an energy concentrator.

FIG. 1 schematically shows in plan an embodiment of a device according to the invention. In this device, an acoustic surface wave transducer 11, for example of the interdigital comb type and having a width L1, defines a first propagation path 21 for acoustic waves on the surface of a first substrate 1 which is for example of piezoelectric material. Disposed on this path 21, perpendicular to the direction of propagation of the waves, is an array 31 of N metal conductive strips which are parallel to each other and have a constant spacing or pitch, equal to p1. In the same way as for the substrate 1, a transducer 12 having a width L2 defines on the surface of a second substrate 2 a propagation path 22 on which there is disposed an array 32 of parallel metal conductive strips, also in the number of N and having a constant spacing or pitch equal to $p2$. The two substrates 1 and 2 are preferably as close to each other as possible and are even advantageously made of the seme block; conductive strips 33 interconnect the respective strips of the arrays 31 and 32.

Different studies have been made concerning the propagation of acoustic surface waves under arrays of parallel conductive strips, such as that published in the article by Messrs. MAERFELD and TOURNOIS entitled "Perturbation theory for the surface wave multistrip coupler" on pages 115 and 116 of Electronics Letters volume 9, No. 5 of Mar. 8, 1973.

Different parameters affect the propagation of an acoustic surface wave under an array of parallel metal conductive strips, such as for example the periodicity $p$ of these strips, their width $a$ and their number N. A way for modifying the propagation velocity $v$ of a wave under such an array may be to provide additional capacitors between the strips and the earth. The maximum variation thus obtainable is defined by the value $K^2$, which is termed the apparent coupling coefficient and which has for expression $$K^2 = 2 \frac{v_b - v_c}{v_R}$$

in which $v_b$ is the velocity of the waves under the strips being in an open circuit, $v_c$ is the same velocity in a short circuit and $v_R$ the Rayleigh velocity.

If there are disposed between adjacent conductive strips additional capacitors of the same value $q$, the velocity $v$ of the acoustic surface wave under the strips is then defined by the equation $$\frac{v}{v_c} - 1 = \frac{K^2}{2} \cdot \frac{1}{1 + q/C}$$

in which C is the initial capacity between two adjacent strips.

In the device shown in FIG. 1, these additional capacitors are constituted in respect of the array 31 by the array 32 and vice versa. The velocity $v_1$ of the acoustic surface wave which would be propagated under the array 31 if the path 22 was not piezoelectric is then given by the equation:

$$\frac{v_1}{v_c} - 1 = \frac{K_2^2}{2} \cdot \frac{1}{1 + \frac{q_2}{C_2}}$$

in which $K_2^2$ is the apparent coupling coefficient of the path 22, $C_2$ the actual capacity between strips of the array 32 and $q_2$ the additional capacity provided by the array 31, the capacity $C_3$ of the array 33 being neglected.

If $p_1$ and $p_2$ are the respective periodicities of the arrays 31 and 32, the apparent velocity $v_{22}$ of the waves on the path 22, seen from the path 21, is equal to $$v_{22} = v_2 \frac{p_1}{p_2}.$$

It is shown that for a number $N_T$ of conductive strips, there is a total energy transfer between the paths 21 and 22 and vice versa when the condition $v_{22} = v_1$ is satisfied.

If it is now considered that the paths 21 and 22 are both simultaneously piezoelectric, an account must be taken of the fact that there are thus two modes of propagation for this structure; one of these modes, termed the symmetric mode, of velocity $V_S$ has amplitudes of the same sign on the paths 21 and 22 whereas the other, of velocity $V_a$, termed the antisymmetric mode, has amplitudes of opposite signs on the same paths.

By a mathematical reasoning, it is shown then that the fraction W of energy transferred from the path 21 to the path 22 is equal to $$W = \frac{\sin^2\left(\frac{\pi N}{2 N_T}\right)}{1 + X^2} \text{ with } X^2 = \frac{p_1}{p_2} \frac{\left(\frac{p_2}{p_1 v_2} - \frac{1}{v_1}\right)^2}{\left(\frac{1}{v_1} - \frac{1}{V_{as_1}}\right)\left(\frac{1}{v_2} - \frac{1}{V_{as_2}}\right)}$$

in which $V_{as_1}$ is the velocity of the antisymmetric mode on the path 21 and $V_{as_2}$ is the velocity of the antisymmetric mode on the path 22, seen from the path 21, and also with $$N_T = \frac{\lambda_1 \sqrt{\frac{(C_1 + C_2 + C_3)2}{C_1 C_2 K_1^2 K_2^2}}}{2 p_1 \sqrt{1 + X^2}}$$

in which $\lambda 1$ represents the acoustic wavelength on the path 21. The condition of total energy transfer is then double and is written on one hand $X^2 = 0$ and on the other hand $N = N_T$. In order to have $X^2 = 0$ it is sufficient that $$v_1 = \frac{p_1}{p_2} v_2,$$

which is the previously mentioned condition. As concerns the condition $N = N_T$, it amounts to choosing the number N of conductive strips in such a way that the phase shift between the symmetric and antisymmetric modes is equal to $\pi$ for the interaction length.

Different applications can be envisaged for the device described hereinbefore, depending on whether one modifies certain of its parameters such as the ratio $p_1/p_2$, the width $a$ of the conductive strips or the widths $L_1$ and $L_2$ of the propagation paths 21 and 22.

Thus the device shown in FIG. 1 may be employed to provide an energy concentrator, that is to say a reduction in the width of the acoustic waves beam emitted, without loss of energy. For this purpose, the number N of conductive strips of the arrays 31 and 32 is chosen to be equal to $N_T$, which value has been defined hereinbefore. The array 32 is chosen to have a width $L_2$ less than $L_1$ and equal to the desired width of the beam. Under these conditions, the velocities $v_2$ and $v_1$ cannot be equal since the additional capacities $q_1$ and $q_2$ are very different. In order to satisfy the total transfer condition $$v_1 = \frac{p_1}{p_2} v_2,$$

it is therefore necessary to choose the periods $p_1$ and $p_2$ to be different. This equation is written again:

$$\frac{p_1}{p_2}\left(1 + \frac{K_2^2}{2} \cdot \frac{1}{1 + \frac{q_2}{C_2}}\right) = 1 + \frac{K_1^2}{2} \cdot \frac{1}{1 + \frac{q_1}{C_1}}$$

If the substrates 1 and 2 are chosen to be identical and preferably in one block and in taking into account the fact that $L_1$ is much greater than $L_2$, for example $L_1/L_2 \geq 10$, the foregoing equation is simplified and becomes:

$$\frac{p_1}{p_2} = \frac{1 + \frac{K_1^2}{2}}{1 + \frac{K_2^2}{2} \frac{L_2}{L_1}}$$

since there is a proportionality between the ratios $q/C$ and $L_1/L_2$.

This simplified equation therefore defines the ratios $p_1/p_2$ of the periodicities of the arrays 31 and 32 that must be chosen to obtain a concentration of the beam of width $L_1$ into a beam of width $L_2$. A similar result can also be obtained by choosing $p_1/p_2 = 1$ but in suitably choosing the widths $a_1$ and $a_2$ of the conductive strips of each one of the networks 31 and 32, bearing in mind that the apparent coupling coefficients $K_1^2$ and $K_2^2$ are known functions of these widths $a_1$ and $a_2$.

As shown by the device of FIG. 1, in an energy concentrator according to the invention, it is unnecessary that the two propagation paths 21 and 22 be parallel to each other, it being understood that a concentrator in which they are in fact parallel operates just as well. This concentrator may be employed in a wide frequency band in contradistinction to known concentrators in which a constant phase shift of $\lambda/4$ between the corresponding bands of the two arrays employed is necessary to obtain the total energy transfer, which limits the frequency band of utilisation.

Figure 2:
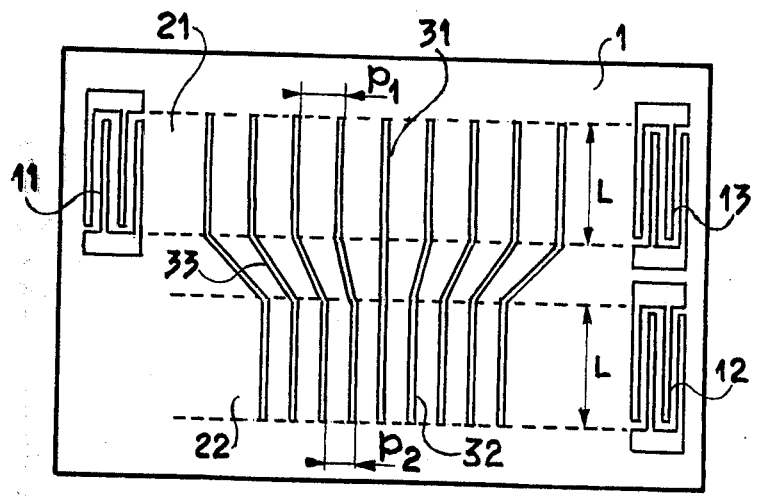
FIG. 2 shows another embodiment of a device according to the invention employed as a coupler.

By way of example, a beam 4mm wide is reduced in a ratio of 10 by employing an energy concentrator according to the invention having two arrays 31 and 32 having 190 conductive strips each, these strips having a width $a_1 = a_2 = 5\mu$ and the pitch of the arrays being respectively chosen equal to $p_1 = 10.1\mu$ and $p_2 = 10\mu$ for an acoustic wavelength $\lambda_1 = 27\mu$ A device according to the invention, in particular similar to that shown in FIG. 2, may also be employed for coupling propagation paths such as 21 and 22 and distributing therebetween the energy of the incident beam. A $n$ dB coupler, $n$ being any suitable number, can thus be constructed provided that $10 \log W = n$; W is, as defined hereinbefore, the fraction of energy transferred from the path 21 to the path 22.

In known multistrip couplers $p_1 = p_2$ and $v_1 = v_2$. Therefore $$W = \sin^2 \frac{\pi N}{2 N_T}.$$

To obtain for example a 3dB coupler, it is necessary to choose $N = (N_T/2)$. Then, a small variation of $N_T$ with the frequency produces a non negligible variation of W, which constitutes an important limitation of the frequency band of utilisation of this coupler. With a coupler according to the invention, $N = N_T$ is advantageously chosen in such manner as to have available the maximum frequency band of utilisation, since the device is then less sensitive to the variation of $N_T$ bearing in mind that $\sin^2 \pi N/2N_T$ is maximum.

There is thus obtained:

$$n_{dB} = 10 \log \frac{1}{1 + X^2}$$

which permits choosing either the ratio $p_1/p_2$ or the values of $a_1$ and $a_2$ satisfying this equation.

The coupler shown in FIG. 2 has two arrays 31 and 32 having respectively distinct pitches $p_1$ and $p_2$ advantageously disposed on a common piezoelectric substrate 1 and having the same width L. The references 11 to 13 designate acoustic surface wave emitting and receiving transducers, for example of the interdigital comb type. By way of example, in order to produce a 3 dB coupler there are chosen $a_1 = a_2 = 5\mu$, $p_1 = 10,2\mu$, $p_2 = 10\mu$, $\lambda_1 = 30\mu$ and N = 78 conductive strips.

In the embodiment shown in FIG. 2, the paths 21 and 22 are parallel; however, they could just as well be non-parallel. The arrangement of the conductive strips is then for example that shown in FIG. 1.

Figure 3:
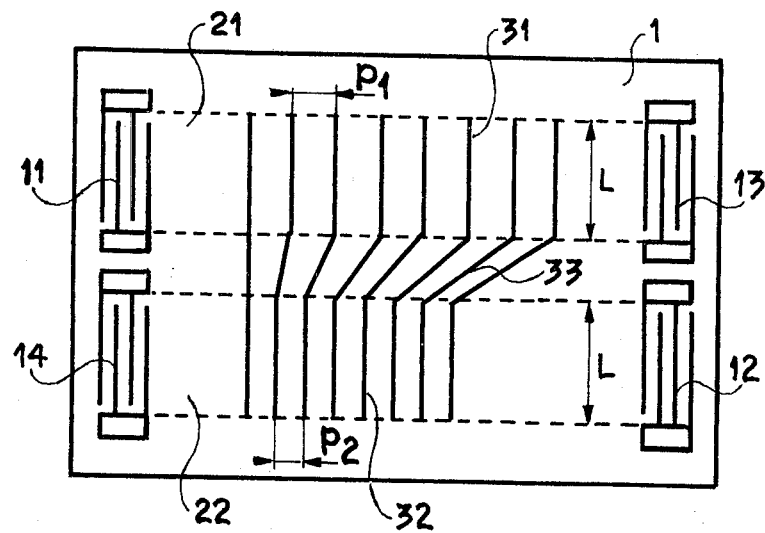
FIG. 3 shows a modification of the embodiment and utilisation of the coupler shown in FIG. 2.

FIG. 3 shows a modification of the embodiment and utilisation of a 3 dB coupler having characteristics similar to those mentioned for the device shown in FIG. 2 but also permitting sum paths and difference paths. If A and B are the amplitudes of the signals respectively emitted by the transducers 11 and 14, it is shown that the amplitudes of the signals received by the transducers 12 and 13 are respectively proportional to A + B and A − B.

Figure 4:
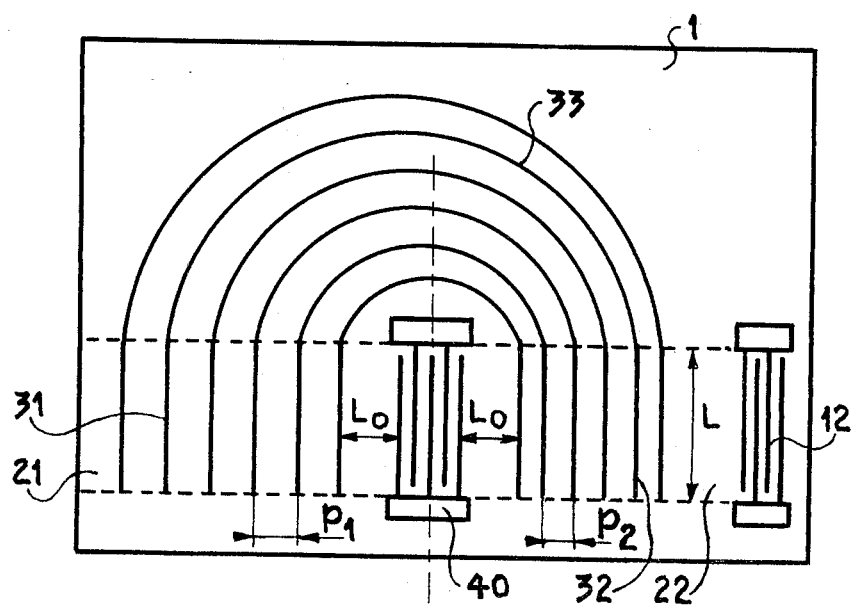
FIG. 4 shows another modification of the embodiment and utilisation of the device shown in FIG. 3.

As concerns the device shown in FIG. 4, it constitutes a modification of the device shown in FIG. 2, in which the paths 21 and 22 are colinear. The emitting transducer 40 is chosen to be of the symmetrical type and is located between and at equal distance $L_o$ from the arrays 31 and 32. The connecting array 33 is then constituted by curved lines. The operation of this device is similar to that of the device shown in FIG. 3 in that it comprises a sum path and a difference path. Owing to the symmetrical structure of the emitting transducer 40, the same signal is sent to the two paths 31 and 32 so that at the output of one path no signal is received, whereas at the output of the other path the transducer 12 receives the whole of the emitted signal. Such a device is for example advantageous in the construction of a unidirectional transducer.

In a modification of the structure shown in FIG. 4, in which the transducer 40 is eliminated and in which a wave is emitted by the transducer 12, the assembly comprising the arrays 31, 32 and 33 operates as a reflector and returns all the energy in the direction of the transducer 12 owing to the combinations of signals on the sum and the difference paths of this device. The foregoing description has described a few applications of the device according to the invention and it must be understood that this encompasses any other application in which there would be used a structure employing two interconnected arrays of parallel conductive strips having different characteristics of periodicity or width of the strips.

As concerns the construction of these devices, it employs the known technique of metal deposit through masks. The phenomenon principally employed since it seems to be the most advantageous is the reciprocal transformation of electrical energy into mechanical energy by the piezoelectric effect, but the invention may also operate with any other effect, such as the electromotive effect or the electrostiction effect for example.

What is claimed is:

1. An acoustic surface wave device comprising:
   a substrate made of a material able to propagate surface acoustic waves;
   at least two paths at the surface of said substrate, for propagation of surface acoustic waves, the material assuming said propagation along each one of said two paths being the same for said two paths;
   at least one input transducer disposed on said substrate for converting high frequency electrical waves applied thereto into acoustic waves propagating along a first one of said two paths;
   at least one output transducer disposed on said substrate for converting surface acoustic waves propagating along the second one of said two paths into electrical waves;
   and an acoustic surface wave coupler disposed on said substrate for providing a coupling between said first and second paths, said coupler comprising a first array of N parallel conductive strips having a width $a_1$, a periodicity $p_1$ and a length $l_1$, disposed on said substrate across said first path and a second array of N parallel conductive strips having a width $a_2$, a periodicity $p_2$, and length $l_2$ disposed on said substrate across said second path, said strips being in each path disposed perpendicularly to the direction of propagation of acoustic waves when propagating along said paths and said two arrays being interconnected by a connecting array of N conductive strips;
   said strips of said first and second arrays having on the one hand for each one of said two arrays, the same width and the same periodicity and having on the other hand at least one of said two geometrical parameters: width, and periodicity, which is different in said two arrays.

2. A device as claimed in claim 1, for constituting an energy concentrator in which the length $L_2$ of the strips of the second path is less than the length $L_1$ of the strips of the first path, one input transducer being disposed at the input of said first path and one output transducer being disposed at the output of said second path, in which the number N of conductive strips of each array is chosen to be equal to a value N corresponding to a phase shift of $\pi$ between the symmetric and antisymmetric modes of propagation of acoustic waves on said paths, and wherein the ratio of the periodicities of the arrays is chosen to be equal to $$\frac{p_1}{p_2} = \frac{1 + K_1^2/2}{1 + \frac{K_2^2}{2} \frac{L_2}{L_1}}$$

$K_1^2$ and $K_2^2$ being the apparent coupling coefficients for said two paths.

3. A device as claimed in claim 1, for constituting a $n$ dB coupler, wherein one input transducer is disposed at the input of said first path, and one output transducer is disposed at the output of each of said two paths, wherein the number N of conductive strips of each array is chosen to be equal to a value $N_T$ corresponding to a phase shift of $\pi$ between the symmetric and antisymmetric modes of propagation of acoustic waves on said paths and wherein the ratio $p_1/p_2$ is chosen in such manner as to satisfy the equation:

$$10 \log \frac{1}{1 + \frac{p_1}{p_2} \frac{\left(\frac{p_2}{p_1 v_2} - \frac{1}{v_1}\right)^2}{\left(\frac{1}{v_1} - \frac{1}{V_{as_1}}\right)\left(\frac{1}{v_2} - \frac{1}{V_{as_2}}\right)}} = n \, dB$$

in which $v_1$ and $v_2$ represent the velocities of the acoustic waves under the arrays and $V_{as}$ and $V_{as}$ the velocities of the antisymmetric mode on the two coupled paths.

4. A device as claimed in claim 3, wherein a further input transducer for sending waves to the coupling is disposed at the input of said second path in such a way that the waves sent in said two paths by said two input transducers when the device is operating reach the coupler in phase, and wherein $n$ is chosen to be equal to $-3$, said two output transducers then receiving respectively, one transducer the sum of the amplitudes of the input signals emitted, and the other the difference of said amplitudes.

5. A device as claimed in claim 1, for constituting an unidirectional transducer wherein the number N of conductive strips of each array is chosen to be equal to a value $N_T$ corresponding to a phase shift of $\pi$ between the symmetric and antisymmetric modes of propagation of acoustic waves on said paths, wherein said two paths for propagation are colinear, and wherein the input transducer is a transducer of symmetrical type disposed between the two paths at equal distance from the two arrays of said two paths so that the signals emitted in opposite directions by said transducer when the device is operating reach the two arrays of the coupler in phase, the ratio $p_1/p_2$ being chosen in such manner as to satisfy the equation:

$$10 \log \frac{1}{1 + \frac{p_1}{p_2} \frac{\left(\frac{p_2}{p_1 v_2} - \frac{1}{v_1}\right)^2}{\left(\frac{1}{v_1} - \frac{1}{V_{as_1}}\right)\left(\frac{1}{v_2} - \frac{1}{V_{as_2}}\right)}} = -n \, dB$$

in which $v_1$ and $v_2$ represent the velocities of the acoustic waves under the arrays and $V_{as}$ and $V_{as}$ the velocities of the antisymmetric mode along said two coupled paths.

* * * * *